United States Patent [19]
Kuriyama

[11] Patent Number: 5,774,393
[45] Date of Patent: Jun. 30, 1998

[54] SEMICONDUCTOR MEMORY DEVICE CAPABLE OF OPERATING AT HIGH SPEED AND STABLY EVEN LOW POWER SUPPLY VOLTAGE

[75] Inventor: Hirotada Kuriyama, Hyogo, Japan

[73] Assignee: Mitsubishi Denki Kabushiki Kaisha, Tokyo, Japan

[21] Appl. No.: 806,176

[22] Filed: Feb. 26, 1997

Related U.S. Application Data

[62] Division of Ser. No. 602,666, Feb. 16, 1996, Pat. No. 5,673,230.

[30] Foreign Application Priority Data

May 30, 1995 [JP] Japan .................... 7-131471

[51] Int. Cl.[6] ........................................ G11C 7/00
[52] U.S. Cl. .................. 365/156; 365/154; 365/230.05
[58] Field of Search .............................. 365/230.05, 154, 365/156; 257/69, 369, 903, 351, 338

[56] References Cited

U.S. PATENT DOCUMENTS

| | | |
|---|---|---|
| 4,461,963 | 7/1984 | Koomen . |
| 4,516,225 | 5/1985 | Frederick . |
| 4,768,172 | 8/1988 | Sasaki ..................................... 365/154 |
| 4,995,001 | 2/1991 | Dawson et al. ........................ 365/154 |
| 4,996,671 | 2/1991 | Suzuki et al. . |
| 5,341,327 | 8/1994 | Kuriyama . |
| 5,521,860 | 5/1996 | Ohkubo .................................. 365/154 |
| 5,526,304 | 6/1996 | Kawamura ............................. 257/369 |
| 5,528,544 | 6/1996 | Kohno . |

OTHER PUBLICATIONS

"An Asymmetric Memory Cell Using a C–TFT for ULSI SRAMs" 1992 Symposium on VLSI Technology Digest of Technical Papers, pp. 38–39.

"A 16–Mb CMOS SRA with a 2.3um$^2$ Single–Bit Line Memory Cell," IEE Journal of Solid–State Circuits, (vol. 28, No. 11, Nov. 1993), pp. 1125–1130.

Primary Examiner—Vu A. Le
Attorney, Agent, or Firm—Lowe, Price, LeBlanc & Becker

[57] ABSTRACT

A memory cell includes a read/write word line R/WL1 driving access transistor Q1 in read and write operations and a write word line WL1 driving access transistor Q2 in the write operation. In the write operation, both access transistors Q1 and Q2 are driven, and storage information is written in the memory cell by a bit line and a /bit line having potentials complementary to each other. On the other hand, in the read operation, only access transistor Q1 is rendered conductive, and storage information is read out through the bit line. Since access transistor Q2 is rendered nonconductive, a P type TFT transistor and an N type transistor operate as a CMOS type inverter having a large voltage gain. Therefore, a sufficient operating margin is secured even in the read operation.

7 Claims, 13 Drawing Sheets

SEMICONDUCTOR MEMORY DEVICE CAPABLE OF OPERATING AT HIGH SPEED AND STABLY EVEN LOW POWER SUPPLY VOLTAGE

This application is a division of application Ser. No. 08/602,666 filed Feb. 16, 1996 U.S. Pat. No. 5,673,230.

BACKGROUND OF THE INVENTION

1. Field of the Invention

The present invention relates to semiconductor memory devices, and more particularly, to a circuit structure of a static type RAM capable of operating under low voltage.

2. Description of the Background Art

In a static type random access memory (hereinafter referred to as an "SRAM"), a memory cell is formed of a flip-flop circuit and access transistors. As a structure of the memory cell, a high resistive load type cell and a CMOS (Complementary Metal Oxide Semiconductor) type cell are known. The high resistive load type cell is advantageous to improvement of the degree of integration, because a resistor can be stacked on a transistor. However, the high resistive load type cell has a disadvantage of lacking in stability of data holding operation. Although the CMOS type cell is superior in stability of data holding operation to the high resistive load type cell, the CMOS type cell has a disadvantage of occupying a large area on a substrate. Therefore, in order to take advantage of the characteristic of the CMOS type cell while maintaining high integration, a technique for structuring a cell with a TFT (Thin Film Transistor) as a load is implemented.

More specifically, a memory cell of the SRAM using the TFT is formed of six elements in total of N type access transistors Q1 and Q2, N type driver transistors Q3 and Q4, and P type load transistors Q5 and Q6, as shown in FIG. 11. N type transistor Q3 and P type transistor Q5 configure a first inverter, and N type transistor Q4 and P type transistor Q6 configure a second inverter. By cross-coupling inputs and outputs of the two inverters, a flip-flop circuit is configured. By using the TFT as the P type load transistor and forming four elements on the substrate and two P type transistors on the four elements, the cell size is reduced. There are two storage nodes A and B, in which storage information is stored. Usually, when storage node A on the bit line side is at a logical high or H-level, the memory cell stores "1" data, and when storage node A is at a logical low or L level, the memory cell stores "0" data.

A read operation and a write operation of the memory cell will be briefly described hereinafter.

As will be described later, a bit line and a /bit line are connected to power supply potential through a bit line load, and the potential of the bit line is usually kept at power supply voltage ($V_{CC}$).

First, assume that driver transistor Q3 is in an on state, that is, a logical value "0" is stored in the memory cell in the circuit of FIG. 11.

In reading out "0" data, the potential level of a word line is pulled up, and access transistors Q1 and Q2 are rendered conductive. In response to this, the potential of the bit line is pulled down because driver transistor Q3 is in an on state. On the other hand, the potential of the /bit line remains at a bias level ($V_{CC}$). The potential difference generated between the bit line and the /bit line is amplified to be read out as storage information.

In writing "1" data, the potential of the word line is pulled up to render access transistors Q1 and Q2 conductive, and then to strongly pull down the potential of the /bit line to the L level. Since the conductance of P type transistor Q6 in conduction is usually smaller than that of N type transistor Q4, the potential at node B is pulled down to the L level, and correspondingly, the potential at node A is pulled up to the H level. More specifically, this corresponds to writing of "1" data in the memory cell.

FIG. 12 is a schematic block diagram showing a circuit structure of an SRAM according to a first conventional example.

For the sake of simplification, a memory cell array including memory cells arranged in two rows and two columns will be described in the following. It is needless to say that similar operation is carried out in a memory cell array including memory cells arranged in more rows and more columns.

In the read operation, address signals and a read/write operation control signal are externally applied to an SRAM 5000. A row address signal applied to an X address buffer 200 is decoded by an X address decoder 202, and the potential of a word line of a corresponding row is pulled up to the H level by a word line driver circuit 204.

A column address signal applied to a Y address buffer circuit 206 is decoded by a Y address decoder 208, and a Y select switch 216 connects a corresponding bit line and a corresponding /bit line to a sense amplifier 212 according to the decoded column address signal.

A read/write buffer circuit 210 activates sense amplifier 212 in response to the read/write operation control signal attaining the H level. An output signal corresponding to storage information amplified by sense amplifier 112 is provided to the outside world through an input/output buffer circuit 218.

In the write operation, similarly to the read operation, the potential level of the word line according to the applied row address signal is pulled up to the H level. The bit line and the /bit line corresponding to the column address signal are connected to a write driver circuit 214 by Y select switch 216.

Read/write buffer circuit 210 drives write driver circuit 214 in response to the read/write operation control signal attaining the L level. The storage information applied through input/output buffer circuit 218 is written in a memory cell corresponding to the address signals by write driver circuit 214.

In this conventional example, a bit line load is structured of P type transistors 410 to 416 which are always in an open state. Therefore, the potentials of the bit line and the /bit line are kept at the power supply potential $V_{CC}$ other than in the read operation and the write operation.

Two complementary bit lines are provided because two complementary bit lines are convenient for high speed reading using an amplifier having differential input, and because the write circuit is simplified.

In recent years, it becomes difficult to operate a memory cell using a TFT load stably under low voltage (3 V or less) of a battery power source or the like. The read operation under low voltage will be described hereinafter in more detail.

In a memory cell at stand-by, access transistors are turned off. Therefore, inverters of the memory cell are each configured of a driver transistor and a load transistor, having a high voltage gain. More specifically, the gradient of a transition portion in the vicinity of a logical threshold value of the output of the inverters is steep. At this time, the noise margin is extremely large, and the memory cell holds data stably.

In a memory cell during the data read operation, the access transistors are turned on, and a column current (current flowing in the memory cell from the bit line or /bit line) flows into storage node B on the L level side. This is equivalent to parallel connection of a load element (load transistor) and a low impedance load (access transistor), and results in absence of a load transistor of high impedance. Therefore, the memory cell inverters must be treated as N type MOS enhancement load type inverters using an access transistor as a load. At this time, the gain of the inverter is substantially lower than that at stand-by, making the gradient of the transition portion of the inverter output gentle. This time is the most dangerous for the memory cell. If the memory cell does not have enough noise margin, the bistable state is lost, and data is destroyed.

On the other hand, since it is difficult in particular to obtain sufficient current performance of the TFT under low voltage, the potential of a storage node corresponding to the H level immediately after writing is at a $V_{CC}$-$V_{thn}$ level which is lower than the power supply voltage by a threshold voltage $V_{thn}$ of the access transistor. More specifically, the bistability of the memory cell must be analyzed for the read operation immediately after the write operation, when the operating margin becomes the lowest.

The read characteristic of the memory cell immediately after writing and a circuit structure of the memory cell corresponding to the read characteristic are shown in FIGS. 13A and 13B, respectively. A curve α in FIG. 13A shows the characteristic of the inverter formed of access transistor Q2 and driver transistor Q4, and a curve β shows the characteristic of the inverter formed of access transistor Q1 and driver transistor Q3. Since the current is small as described above, the influence of load transistors Q5 and Q6 here can be ignored.

Crossing points a and b of the curves α and β are stable points of the memory cell. Crossing point a corresponds to the case where the memory cell stores "0" data, and crossing point b corresponds to the case where the memory cell stores "1" data.

A portion C in FIG. 13A corresponds to a threshold voltage $V_{athn}$ of access transistor Q2, and a portion D corresponds to a threshold voltage $V_{dthn}$ of driver transistor Q3. A remaining portion E of the power supply voltage $V_{CC}$ minus C and D corresponds to a margin region for stabilizing the read operation of the memory cell. It is difficult to reduce the threshold voltages of the access transistors and the driver transistors to a predetermined value or less in order to suppress the subthreshold leakage current of these transistors to a substantially low value or the like. Therefore, the margin region E decreases when the read voltage $V_{CC}$ becomes low, making the read operation unstable.

Portions indicated by m and n in FIG. 13A are called "an eye of a cell." The region corresponding to this eye of a cell becomes smaller in a region where the power supply voltage is low, making the operation unstable.

Therefore, in order to improve as much as possible an operating margin of a memory cell which operates under low voltage, a ratio of a current supplying capability of the driver transistor to that of the access transistor (cell ratio) is made sufficiently large.

More specifically, when the H level is stored in storage node A, if the current supplying capability of driver transistor Q4 is larger between access transistor Q2 and driver transistor Q4 connected to storage node B in which the L level is stored, the potential at storage node B becomes stable at the L level. This corresponds to a value indicated by F in FIG. 13A becoming smaller.

The current supplying capability of an MOS transistor is generally represented by the magnitude of β when a drain current $I_D$ in a saturation region is expressed by the following expression (1):

$$I_D = \beta(V_{GS} - V_{th})^2/2 \qquad (1)$$

In the expression, $V_{GS}$ denotes a gate-to-source voltage, and $V_{th}$ denotes a threshold voltage of the transistor.

The cell ratio was conventionally set at a value of 3 or more, taking the operating margin into consideration.

However, this memory cell suffers from the following disadvantages:

i) When the gate width of the driver transistor is made wider in order to increase the cell ratio, the cell size is increased.

ii) In order to increase the cell ratio, it is possible to decrease performance of the access transistor. However, in this case, the condition for ion implantation in the manufacturing process of the transistor must be adjusted in order to increase the parasitic resistance value, which makes the manufacturing process more complicated.

iii) Even if the cell ratio can be set at a value of 3 or more, areas corresponding to the magnitudes of the threshold voltages of the access transistor and the driver transistor (the portions C and D in FIG. 13A) are large. Therefore, it is difficult to secure the operating margin, whereby operation under lower voltage, that is, operation under 2 V or less becomes difficult.

In order to solve such problems as described above, a second conventional example is disclosed by H. Kuriyama et al., "An Asymmetric Memory Cell Using a C-TFT for ULSI SRAMs," Digest of Technical Papers presented at IEEE Symposium on VLSI Tech., (1992): 38.

FIG. 14A is a circuit diagram showing a memory cell of the second conventional example.

The second conventional example is different from the first conventional example in the following three points:

i) The word line is divided into a word line for writing only (W word line) and a word line for reading only (R word line). More specifically, during the read operation, only access transistor Q1 is driven, and during the write operation, only access transistor Q2 is driven.

ii) Only one bit line corresponds to one memory cell.

iii) Driver transistor Q4 is also structured of the TFT.

By being thus structured, the second conventional example has the following advantages over the first conventional example.

In the read operation, access transistor Q2 is in an off state. Therefore, an inverter is formed of load transistor Q6 and driver transistor Q4. More specifically, the load transistor is structured of a P type MOS transistor, so that the voltage gain of the inverter increases, and the noise margin of the memory cell is improved.

Further, since driver transistor Q4 is also the TFT, the area of the memory cell can be made much smaller.

However, the second conventional example has the following problems.

For the sake of description of the above problems, assume that storage node A is at the L level as its initial state, and that "0" data is stored in the memory cell.

Consider the case where "1" data is written in the memory cell in this state. Operating states of the bit line, the word lines, and the respective transistors in this state are shown in FIG. 14B.

The potential of the word line for writing is pulled up to the H level, and access transistor Q2 is rendered conductive. On the other hand, access transistor Q1 remains non-conductive. At this time, the potential of the bit line is pulled down to the L level. Therefore, the potential of storage node B, the potential of the gate of driver transistor Q3, and the potential of the gate of load transistor Q5 all attain the L level.

More specifically, driver transistor Q3 is rendered non-conductive, load transistor Q5 is rendered conductive, and storage node A is charged up to the H level.

However, load transistor Q5 is the TFT, and the current supplying capability is not enough. Therefore, a long time (on the order of $\mu$sec) is required for storage node A to attain the H level, resulting in time required for the write operation being much longer than the case of the first conventional example.

SUMMARY OF THE INVENTION

One object of the present invention is to provide an SRAM including a memory cell having a sufficient operating margin even if power supply voltage becomes low.

Another object of the present invention is to provide an SRAM having a memory cell which does not bring about increase in time required for a write operation even under low voltage.

In brief, according to one aspect of the present invention, a static type semiconductor memory device includes a memory cell array, first and second bit lines, first and second word lines, a write operation control circuit, and a read operation control circuit. The memory cell array includes a plurality of memory cells. Each memory cell includes a flip-flop circuit having a first inverter formed of a first driver transistor of a first conductivity type and a first load transistor of a second conductivity type and a second inverter formed of a second driver transistor of the first conductivity type and a second load transistor of the second conductivity type, a first access transistor of the first conductivity type connected to an output node of the first inverter, and a second access transistor of the first conductivity type connected to an output node of the second inverter. The first and second bit lines are connected to at least one of the memory cells through the first and second access transistors, respectively. The first and second word lines are connected to the gates of the first and second access transistors, respectively. When storage information is written in the memory cell, the write operation control circuit controls the potentials of the first and second word lines to render the first and second access transistors conductive to transmit the complementary potentials of the first and second bit lines to the memory cell. When storage information is read out from the memory cell, the read operation control circuit controls the potential of the first word line to render the first access transistor conductive to transmit an output of the first inverter to the first bit line.

According to another aspect of the present invention, a static type semiconductor memory device includes a memory cell array, first and second bit lines, a bit line load circuit, and a word line. The memory cell array includes a plurality of memory cells. Each memory cell array includes a flip-flop circuit having a first inverter formed of a first driver transistor of a first conductivity type and a first load element and a second inverter formed of a second driver transistor of the first conductivity type and a second load element, a first access transistor of the first conductivity type connected to an output node of the first inverter, and a second access transistor of the first conductivity type connected to an output node of the second inverter. The first and second bit lines are connected to at least one of the memory cells through the first and second access transistors, respectively. The bit line load circuit is connected between each bit line and a power source. The bit line load circuit includes a first bit line load MOS transistor supplied with a first potential at its gate and connected between the bit line and the power source. The word line is connected to the gates of the first and second access transistors in common. The current supplying capability of the first bit line load MOS transistor is five times or less that of the access transistor connected to a corresponding bit line, and the current supplying capability of the driver transistor to which the access transistor is connected is at least that of the access transistor.

According to still another aspect of the present invention, a static type semiconductor memory device includes a memory cell array, first and second bit lines, a bit line load circuit, a word line, a write operation control circuit, and a read operation control circuit. The memory cell array includes a plurality of memory cells. Each memory cell includes a flip-flop circuit having a first inverter formed of a first driver transistor of a first conductivity type and a first load element and a second inverter formed of a second driver transistor of the first conductivity type and a second load element, a first access transistor of the first conductivity type connected to an output node of the first inverter, and a second access transistor of the first conductivity type connected to an output node of the second inverter. The first and second bit lines are connected to at least one of the memory cells through the first and second access transistors, respectively. The bit line load circuit is connected between each bit line and a power source. The bit line load circuit includes a depletion type MOS transistor connected between the bit line and the power source and having its gate potential controlled by the read operation control circuit. The word line is connected to the gates of the first and second access transistors in common. When storage information is written in the memory cell, the write operation control circuit controls the potential of the word line to render the first and second access transistors conductive to transmit the complementary potentials of the first and second bit lines to the memory cell. When storage information is read out from the memory cell, the read operation control circuit controls the potential of the word line to render the first and second access transistors conductive to transmit outputs of the first and second inverters to the first and second bit lines, respectively, and sets the gate potential of the depletion type MOS transistor to a first potential. When storage information is not read out from the memory cell, the read operation control circuit sets the gate potential of the depletion type MOS transistor to a second potential.

Since only the first access transistor is driven in the read operation, a voltage gain of the inverter on the side to which the second access transistor is connected can be held high, whereby the memory cell operation can be stabilized. In the write operation, since the first and second access transistors are driven, and data is written by the first and second bit lines having complementary potentials to each other, time required for the write operation does not increase. This is the main advantage of the present invention.

Since the current supplying capabilities of the first bit line load transistor, the access transistor, and the driver transistor satisfy a predetermined relationship, the memory cell operation is stabilized even under low voltage. This is another advantage of the present invention.

Since the bit line load circuit is configured of the first and second bit line load MOS transistors connected to each other in parallel, the current supplying capability of the bit line load circuit can be changed between the read operation and the other operations, making it possible to implement both stabilization of the read operation and a stable storage information holding operation. This is a further advantage of the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
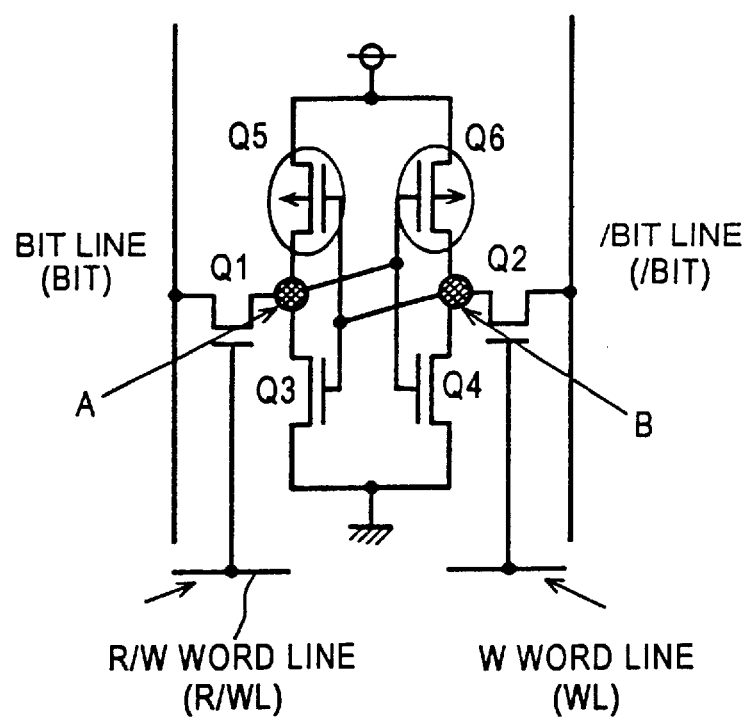
FIG. 1 is a circuit diagram showing a structure of a memory cell of an SRAM according to a first embodiment of the present invention.

Referring to FIG. 1, a memory cell of an SRAM according to the first embodiment of the present invention is so structured that a word line is separated into two word lines, unlike the conventional memory cell. A read/write word line (hereinafter referred to as an "R/W word line") is connected to the gate of access transistor Q1, and a write word line (hereinafter referred to as a "W word line") is connected to the gate of access transistor Q2. Further, a bit line exhibits a complementary structure formed of a bit line and a /bit line.

Figure 2:
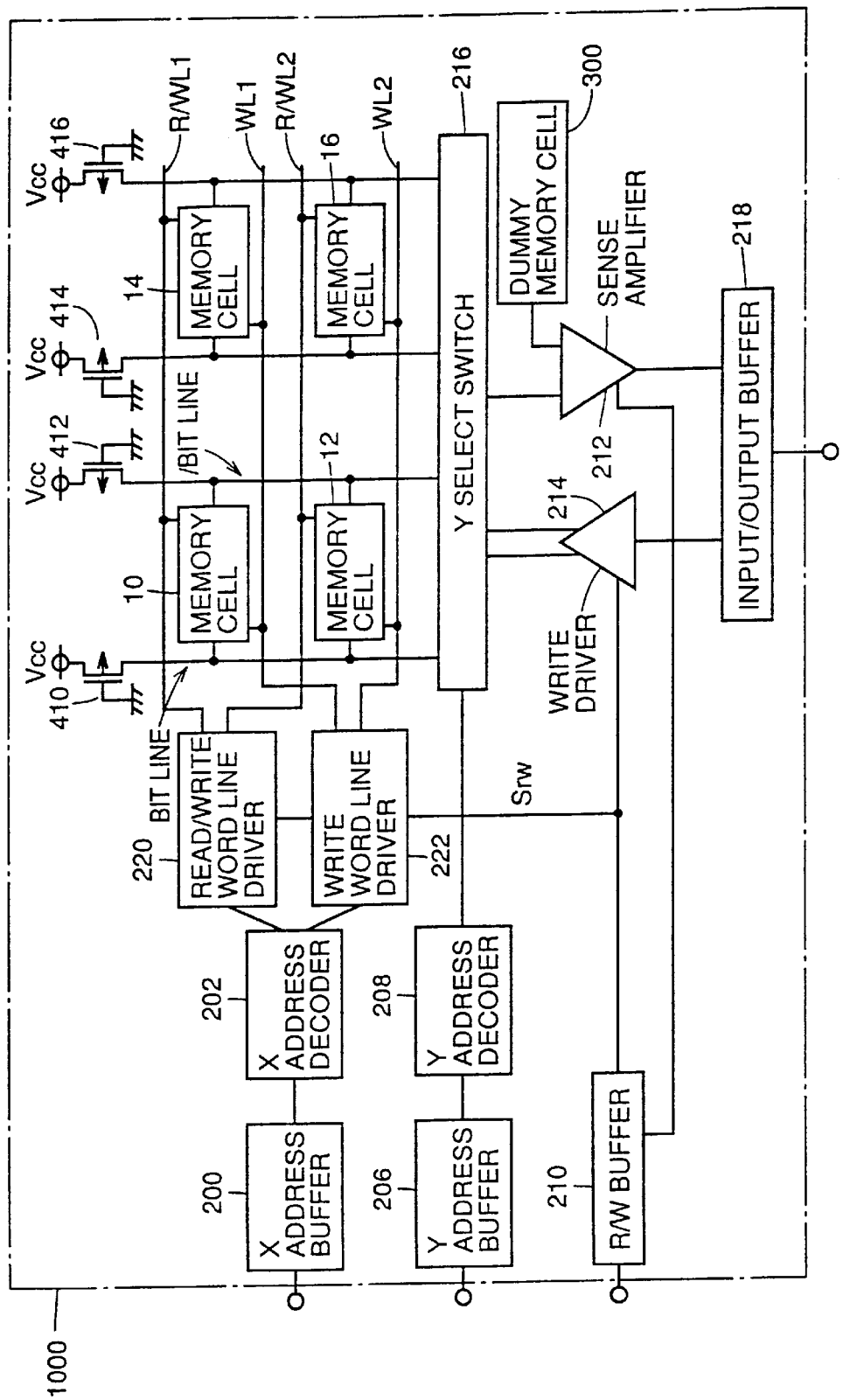
FIG. 2 is a schematic block diagram showing a structure of the SRAM according to the first embodiment of the present invention.
Figure 12:
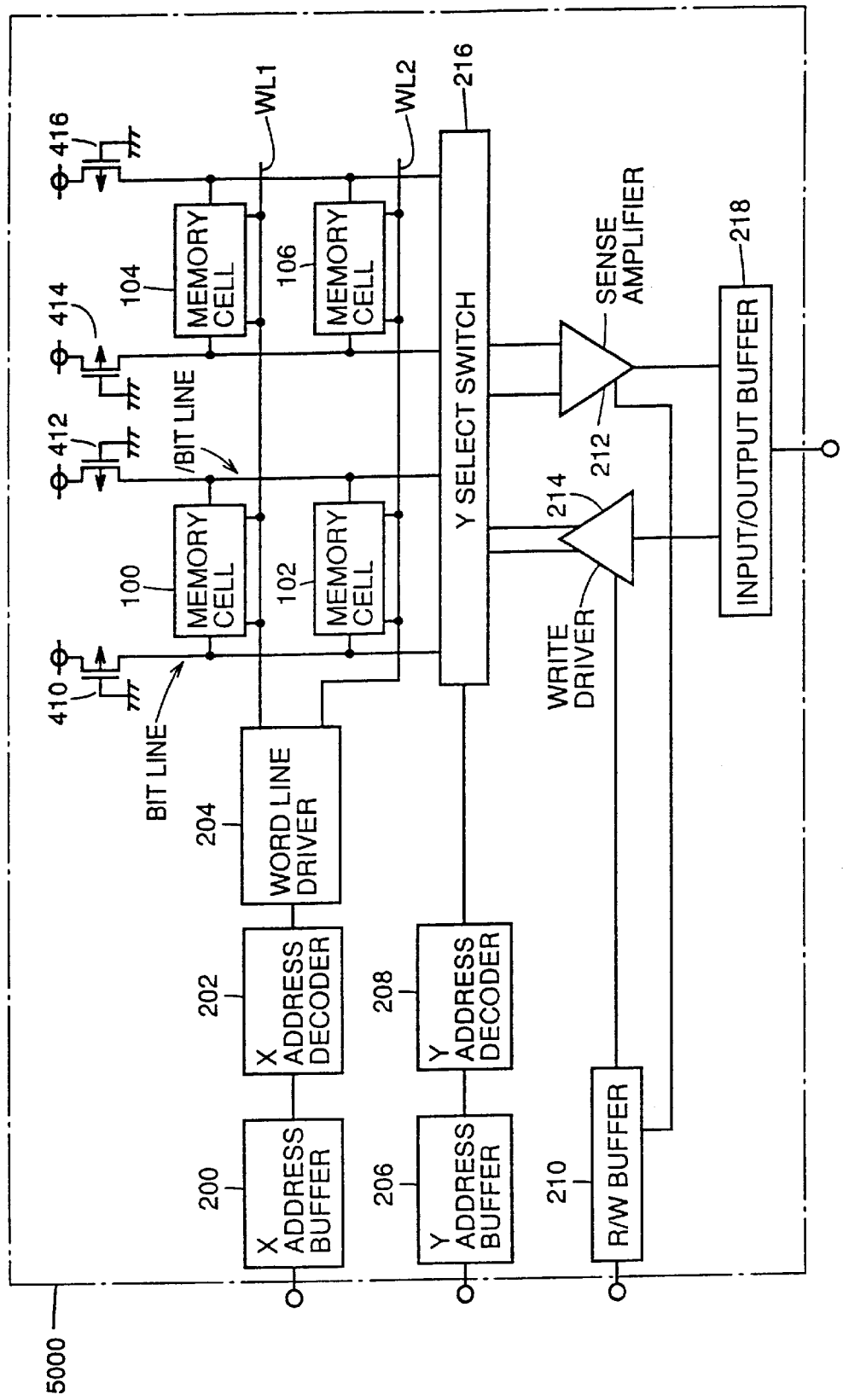
FIG. 12 is a schematic block diagram showing a structure of the SRAM according to the first conventional example.

The structure of the SRAM according to the first embodiment of the present invention, which is shown in FIG. 2, is different from that of the first conventional example shown in FIG. 12 in the following four points.

First, memory cells 10 to 16 exhibit such a structure as shown in FIG. 1.

Second, the word line driver circuit is separated into two circuits of a write/read word line driver circuit 220 and a write word line driver circuit 222.

Third, read/write word line driver circuit 220 and write word line driver circuit 222 are controlled in response to a signal srw from a read/write buffer circuit 210.

Fourth, a dummy memory cell 300 is connected to one output of a sense amplifier 212.

Referring to FIGS. 1 and 2, operation will now be described. Although two of the bit line and the /bit line are used in both the read operation and the write operation in the first conventional example, only the bit line is used in the read operation, and both the bit line and the /bit line are used in the write operation in the present embodiment.

In the following description, it is assumed that the read operation and the write operation are carried out with respect to memory cell 10, and that the potential level at storage node A of memory cell 10 is at the L level.

In the read operation, a row address signal is externally applied to X address buffer circuit 200, and decoded in X address decoder 202. In response to the row address signal from X address decoder 202 and the signal srw from read/write buffer circuit 210, read/write word line driver circuit 220 pulls up the potential of a read/write word line R/WL1 to the H level. In response to this, access transistor Q1 is rendered conductive. Since the potential at storage node A is at the L level, and driver transistor Q3 is in an on state, the potential of the bit line becomes lower than the power supply potential $V_{CC}$.

In order to amplify a small potential difference generated at this time, inputs to sense amplifier 212 are preferably of a complementary type. However, in the present embodiment, since the read operation uses only the bit line, the bit line selected by Y select switch 216 is connected to one input of sense amplifier 212 and dummy memory cell 300 is connected to the other input of sense amplifier 212, in response to an externally applied column address signal. More specifically, the input potential from dummy memory cell 300 provides a reference potential for the read operation of storage information from memory cell 10. Such a structure using a dummy memory cell as described above is disclosed by K. Sasaki et al. "A 16-Mb CMOS SRAM with a 2.3-$\mu m^2$ Single-Bit Line Memory Cell," IEEE Journal of Solid-State Circuits, (Vol. 28, No. 11, November 1993): 1125. Since the read operation is carried out in such a structure as described above, access transistor Q2 remains non-conductive during the read operation.

In the write operation, in response to the signal srw according to a write operation control signal applied to read/write buffer circuit 210 and the externally applied row address signal, write word line driver circuit 222 and read/ write word line driver circuit 220 are driven, and corresponding word lines WL1 and R/WL1 are both pulled up to the H level. In response to this, access transistors Q1 and Q2 are rendered conductive.

On the other hand, in response to the externally applied column address signal, Y select switch circuit 216 connects the corresponding bit line and /bit line and write driver circuit 214. By external application of the write operation control signal to read/write buffer circuit 210, write driver circuit 214 is activated. When "1" data is written in memory cell 10, for example, write driver circuit 214 brings the potential of the bit line to the H level and the potential of the /bit line to the L level, in response to a signal at the H level externally applied to input/output buffer circuit 218.

Therefore, the potential of storage node B is pulled down to the L level by the bit line through access transistor Q2. On the other hand, storage node A is charged up to the H level by the bit line through access transistor Q1. Therefore, unlike the second conventional example, since storage node A is charged by access transistor Q1 having a sufficient current supplying capability, time required for the write operation does not increase.

Figure 3:
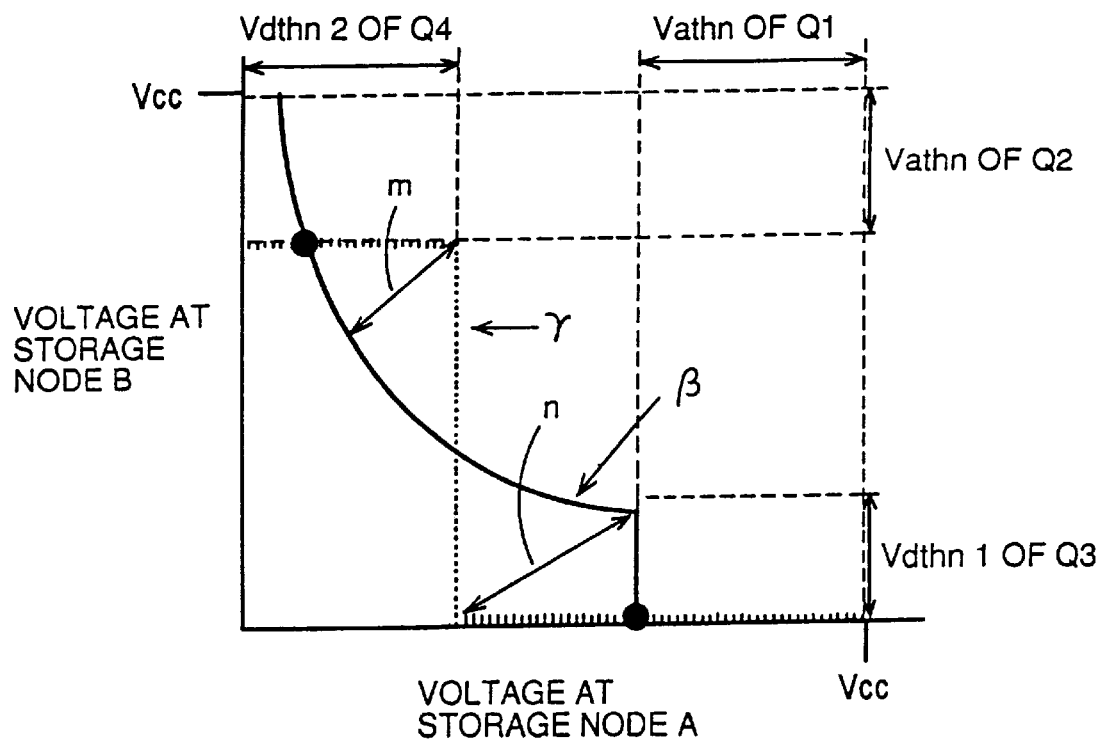
FIG. 3 is a characteristic diagram of the memory cell showing operation of the first embodiment of the present invention.
Figure 13A:
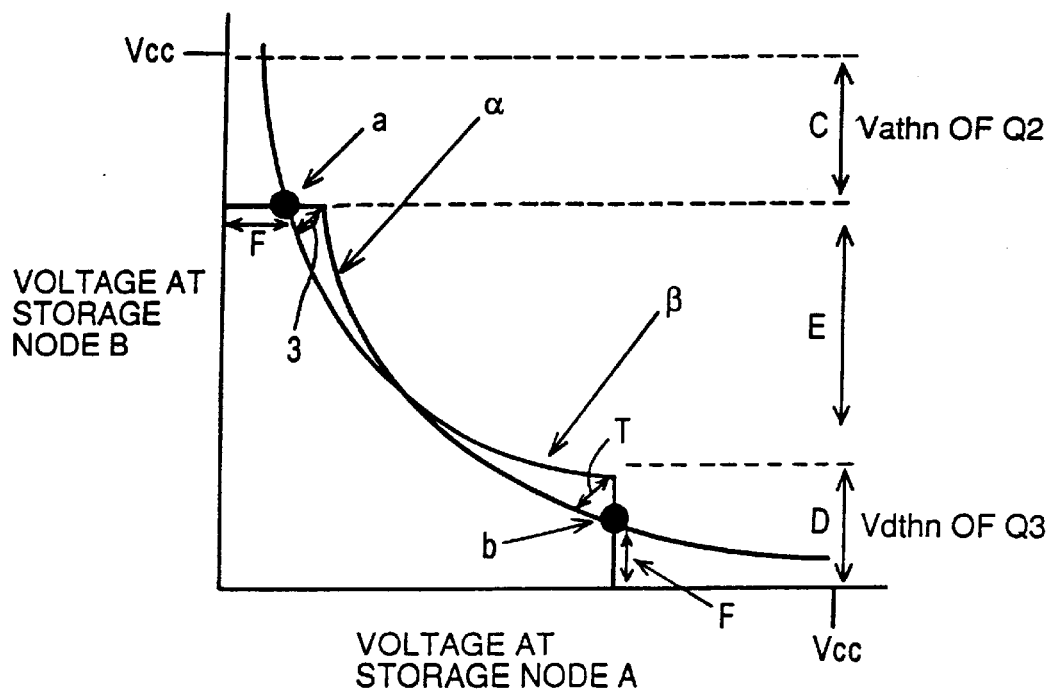
FIG. 13A is an operation characteristic diagram showing operation of the memory cell according to the first conventional example.
Figure 13B:
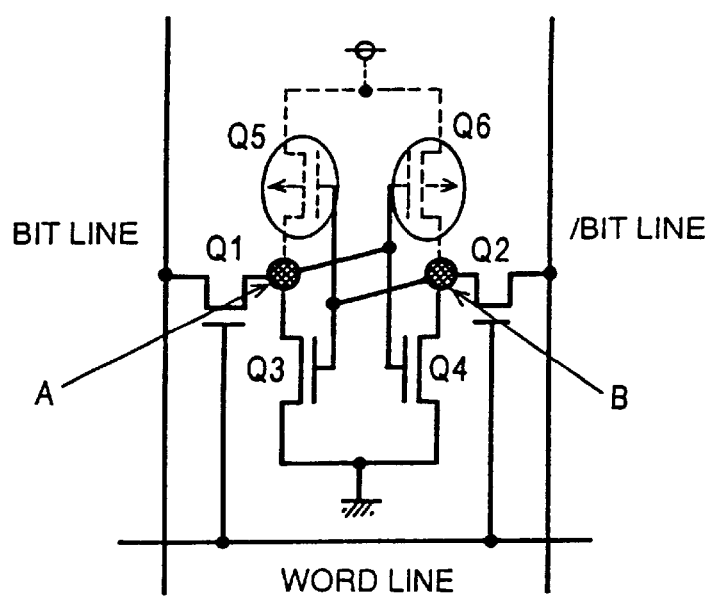
FIG. 13B is a circuit diagram showing the operation characteristic of the memory cell of FIG. 13A.
Figure 14A:
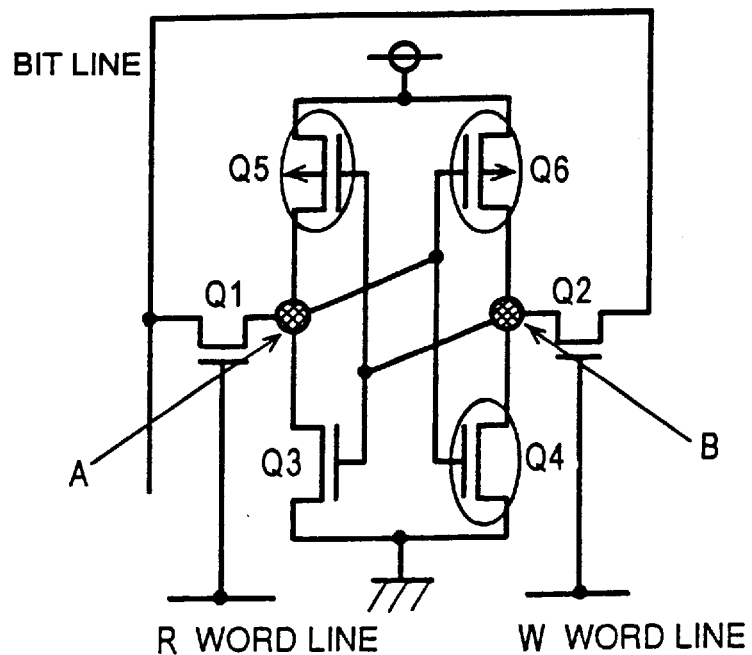
FIG. 14A is a circuit diagram showing a structure of a memory cell according to a second conventional example.
Figure 14B:
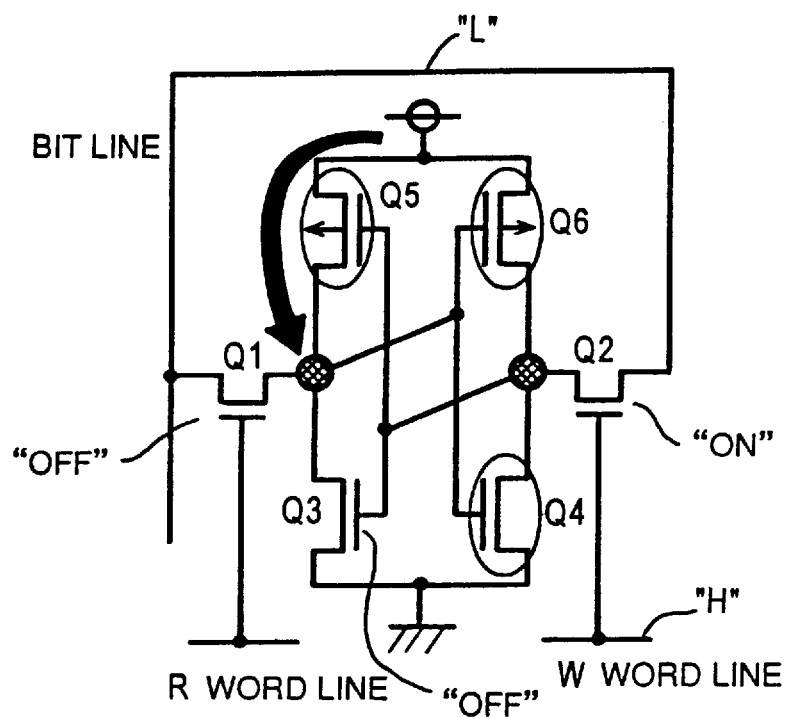
FIG. 14B is a diagram showing a write operation to the memory cell of FIG. 14A.

FIG. 3 shows the read characteristic immediately after writing of the first embodiment. The read characteristic of FIG. 3 is different from that of FIG. 13 in that the characteristic a of the inverter formed of access transistor Q2 and driver transistor Q4 is changed to a characteristic γ of the inverter formed of load transistor Q6 and driver transistor Q4. By the load of the inverter being changed from the N type transistor to the P type transistor and the inverter being formed into a CMOS circuit structure, the voltage gain of the inverter becomes larger, and the regions m and n which are called "eyes of a cell" become sufficiently larger than the case of the first conventional example. In this case, since the regions of the "eyes of a cell" become sufficiently large, a sufficient operating margin can be secured even if the cell ratio is decreased from three, which is a conventional value, down to two, for example.

As described above, according to the first embodiment, the read operation of a memory cell is stabilized. Further, since a gate area of a transistor is generally one of factors determining the area of a memory cell, and the gate width of the driver transistor can be reduced by reduction of the cell ratio, the size of the memory cell can be reduced, which advantageously contributes to higher integration.

Further, the lower limit of the operation threshold value in the read operation of the present embodiment is determined by the logical threshold value of the inverter formed of load transistor Q6 and driver transistor Q4. More specifically, referring to FIG. 3, when the region m or the region n disappears, the memory cell is not able to operate. The larger region m corresponds to a higher logical threshold value and the larger region n corresponds to a low logical threshold value.

The region n tends to be smaller in operation under low voltage. Therefore, it is necessary to adjust the characteristics of load transistor Q6 and driver transistor Q4 so that the region n exists even at the lower limit of the operating power supply potential.

In the characteristic curve β of the inverter formed of access transistor Q1 and driver transistor Q3, the voltage at storage node A cannot exceed the power supply potential $V_{CC}$ minus the threshold voltage of access transistor Q1. Therefore, the region n can be secured by setting the logical threshold value of the inverter characteristic curve γ to one half or less the lower limit of the operating power supply voltage. By such setting, an operating margin can be obtained even in operation under low voltage.

On the other hand, since driver transistor Q4 is not used in the read operation, reduction of the amount of the drain current of this transistor does not have any influence on the reading speed. Therefore, the amount of the drain current of driver transistor Q4 can be more reduced than that of driver transistor Q3.

Therefore, the threshold voltage $V_{dthn2}$ of driver transistor Q4 can be set higher than the threshold voltage $V_{dthn1}$ of driver transistor Q3, for example. In this case, since the region m becomes larger in FIG. 3 as the threshold voltage $V_{dthn2}$ of driver transistor Q4 is larger, the operating margin in the case where the storage level of storage node A is at the L level is secured.

The amount of the drain current of driver transistor Q4 can be reduced more substantially than that of driver transistor Q3 not only by adjusting the threshold voltage as described above but also by making the gate width of driver transistor Q4 narrower than that of driver transistor Q3. In this case, the area of the memory cell can be made smaller by the reduced gate width of driver transistor Q4.

[Second Embodiment]

Figure 4A:
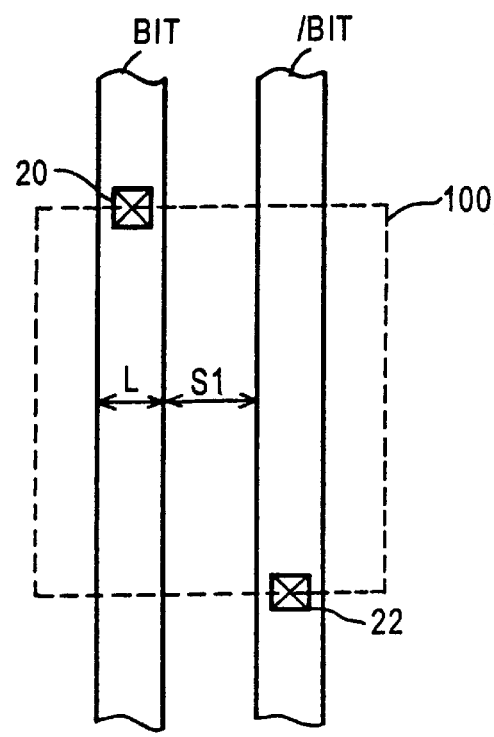
FIGS. 4A and 4B are diagrams showing a conventional bit line pattern of an SRAM and a bit line pattern of an SRAM according to a second embodiment of the present invention, respectively.
Figure 4B:
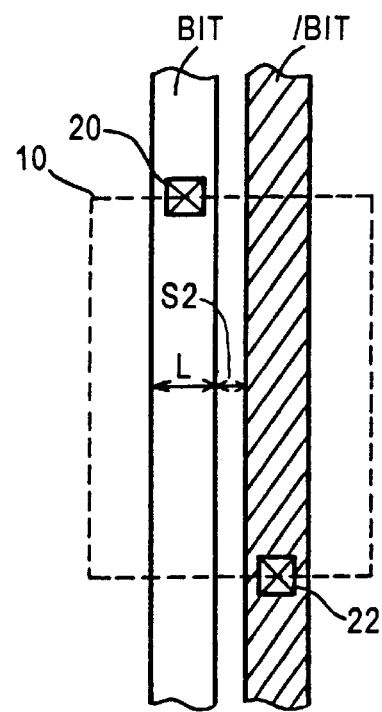

FIG. 4A shows an example of a pattern of the bit line (BIT) and the /bit line (/BIT) for a conventional memory cell 100, and FIG. 4B shows an example of a pattern of the bit line (BIT) and the /bit line (/BIT) for memory cell 10 of the second embodiment of the present invention.

The bit line and the /bit line are connected to a memory cell through bit line contacts 20 and 22, respectively.

A metal interconnection such as an interconnection with an aluminum base (hereinafter referred to as an "Al interconnection") was conventionally used for the bit line and the /bit line. If an interconnection having a low resistance such as the Al interconnection is not used, a delay time determined by the resistance value and the parasitic capacitance value of the bit line becomes longer, thereby decreasing the reading speed.

However, in the first embodiment, since the /bit line is not used for the read operation, even if the Al interconnection is not used for the /bit line, the /bit line does not have any influence on the reading speed. The pitch between the Al interconnections is one factor which determines the size of a memory cell. If one shown in the first embodiment is used as a memory cell, the Al interconnection can be used for the bit line, and a lower level interconnection of the Al interconnection, for example, a silicide interconnection can be used for the /bit line. Since the bit line and the /bit line belong to different interconnection layers, the pitch between the bit line and the /bit line determined by a process margin in the processing step of the bit line can be made smaller. Therefore, as shown in FIGS. 4A and 4B, the shorter side of memory cell 10 can be made smaller than that of the conventional memory cell 100, allowing reduction of the size of the memory cell.

Figure 5A:
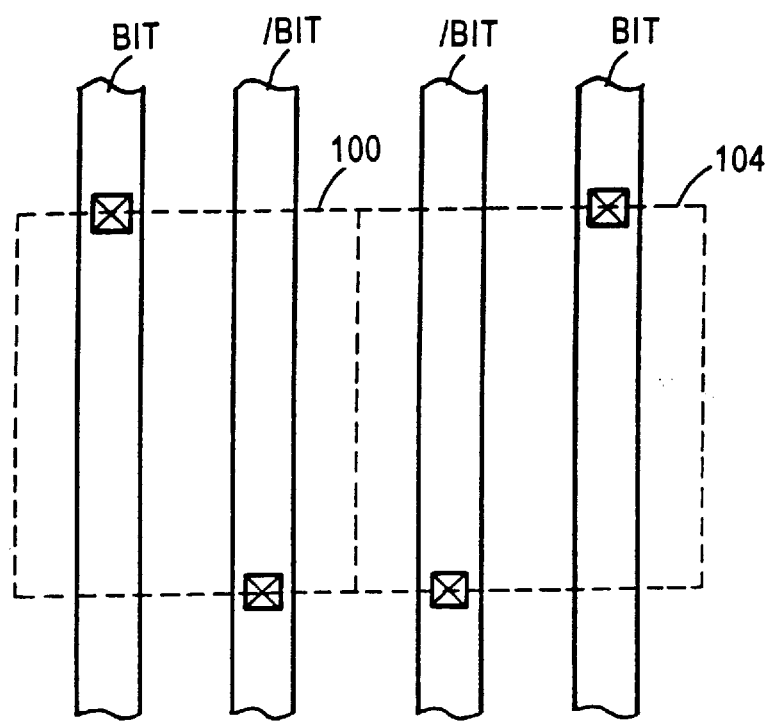
FIGS. 5A and 5B are diagrams showing the conventional bit line pattern and the bit line pattern according to the present invention in the case where two memory cells are arranged.
Figure 5B:
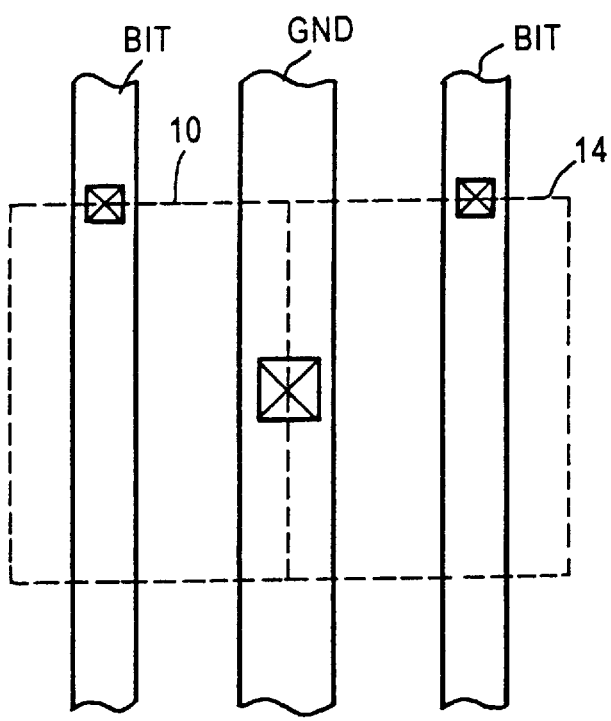

Further, since only one Al interconnection corresponds to one memory cell, the pitch between the Al interconnections can be made wider than the conventional case, even if the size of the memory cell is reduced, as shown in FIGS. 5A and 5B. FIG. 5A shows a pattern of bit lines and /bit lines when two conventional memory cells are arranged side by side, and FIG. 5B shows a pattern of the bit lines when two memory cells according to the second embodiment are arranged side by side.

In the present embodiment, the interval between the bit lines formed of the Al interconnection is larger than the conventional case. Therefore, a GND interconnection can be formed between the bit lines. By this GND interconnection, the GND potential can be supplied to each memory cell stably, whereby operation of the memory cell under low voltage can be more stabilized.

[Third Embodiment]

Figure 6:
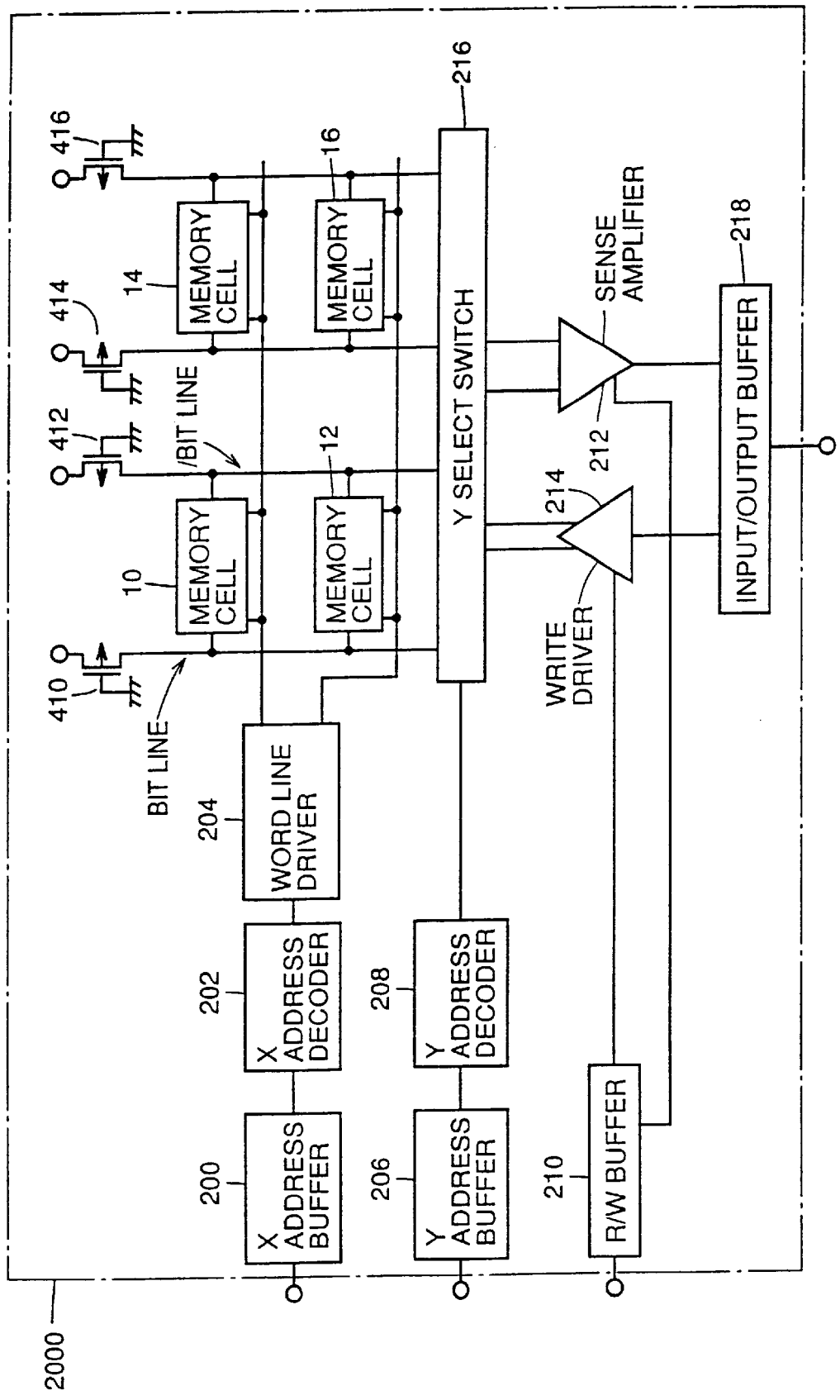
FIG. 6 is a schematic block diagram showing a structure of an SRAM according to a third embodiment of the present invention.

FIG. 6 is a schematic block diagram showing a circuit structure of an SRAM 2000 according to the third embodiment of the present invention.

This embodiment has a basic structure similar to that of the first conventional example. This embodiment is different from the first conventional example in that the following limitation is added to the transistor size of bit line load transistors 410 to 416.

Conventionally, the current supplying capability of the bit line load transistor is ten times or more those of access transistors Q1 and Q2. In the present embodiment, the current supplying capability of the bit line load transistor is five times or less those of access transistors Q1 and Q2.

Operation will now be described. Since a memory cell per se has a similar structure to that of the first conventional example, description will be given with reference to the structure of the memory cell shown in FIG. 11.

Assume that the power supply voltage is 3 V, for example. A drain current value $I_d$ in the case where both a drain voltage $V_d$ and a gate-to-source voltage $V_g$ of the bit line load transistor are −3 V is 1.0 to 3 mA. On the other hand, in the case of the access transistor, $I_d$ is approximately 100 $\mu$A when $V_d=V_g=3$ V, and in the case of the driver transistor, $I_d$ is approximately 200 $\mu$A under the same condition as that of the access transistor.

Figure 11:
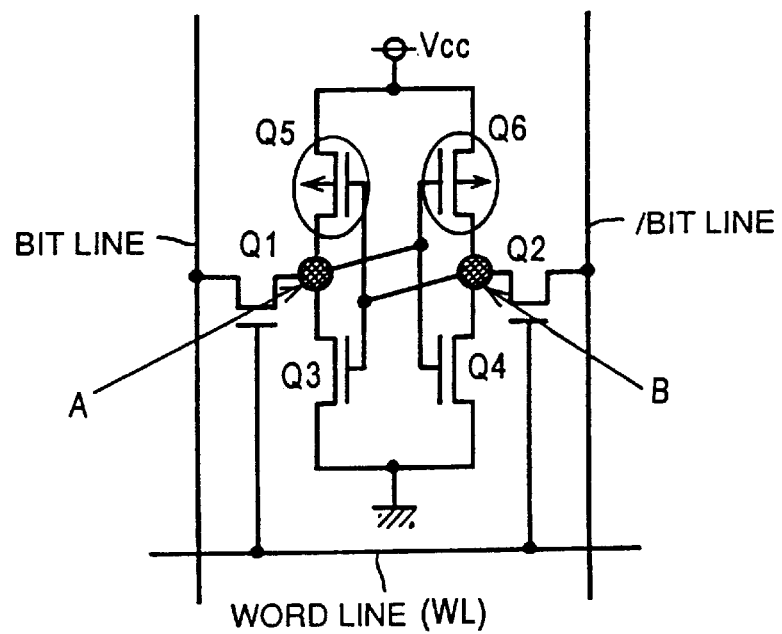
FIG. 11 is a circuit diagram showing a structure of a memory cell of an SRAM according to a first conventional example.

Description will be given by taking a more specific example. Assume that the respective drain current values of the bit line load transistor, the access transistor, and the driver transistor when $V_d=V_g=-3$ V (in the case of the P type transistor) or $V_d=V_g=3$ V (in the case of the N type transistor) are 1.2 mA, 100 $\mu$A, and 200 $\mu$A, and that storage node A of FIG. 11 is at the L level and storage node B of FIG. 11 is at the H level. At this time, the potential of the bit line is 2.8 V, and storage node A is 0.7 V. If the threshold value of driver transistor Q4 is 0.7 V, the H level of storage node B is pulled down by driver transistor Q4 being rendered conductive, causing destruction of data.

On the other hand, in the present embodiment, the H level is not pulled down, and data is not destroyed. A specific example of the present embodiment will be given. Assume that the respective drain current values of the bit line load transistor, the access transistor, and the driver transistor when $V_d=V_g=-3$ V (in the case of the P type transistor) or $V_d=V_g=3$ V (in the case of the N type transistor) are 33 $\mu$A, 100 $\mu$A, and 200 $\mu$A, and that storage node A of FIG. 11 is at the L level, and storage node B of FIG. 11 is at the H level. At this time, the potential of the bit line attains 1.5 V, and the potential of storage node A attains 0.5 V. Since the potential 0.5 V of storage node A is sufficiently lower than a general value 0.7 V of the threshold voltage of driver transistor Q4, data is not destroyed.

Figure 7:
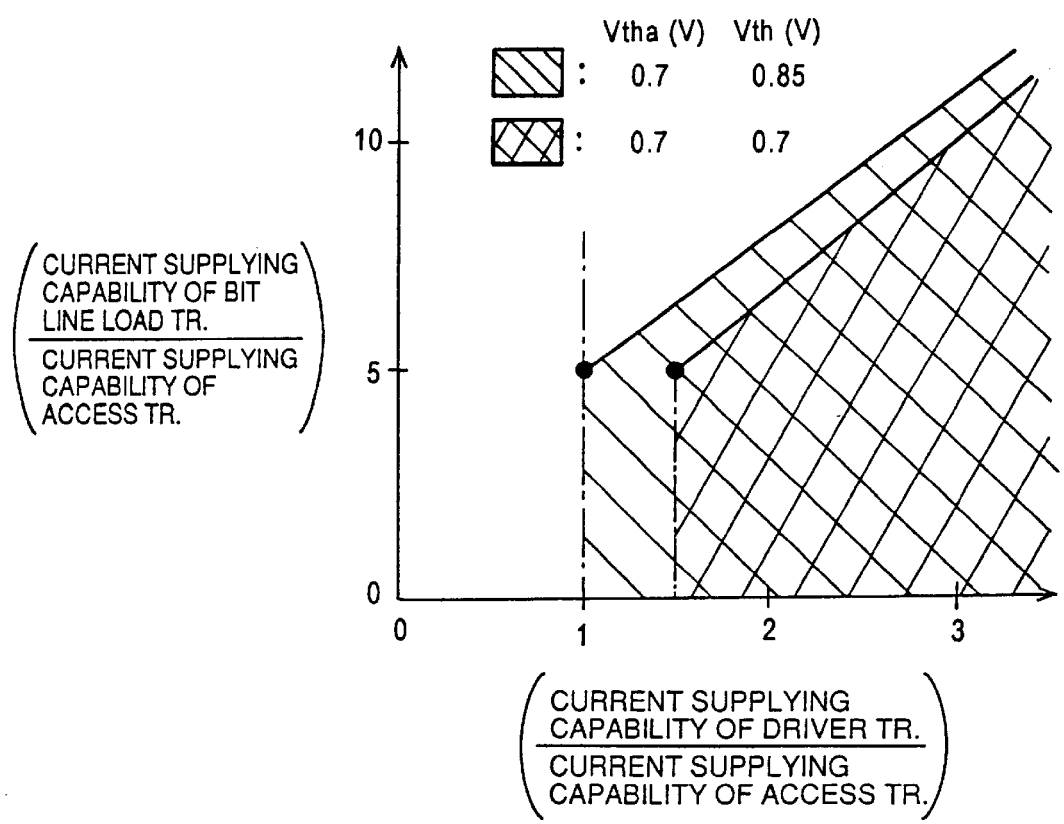
FIG. 7 is a diagram showing a characteristic of a memory cell according to the third embodiment of the present invention.

The result is shown in FIG. 7 which is obtained by calculating a region of the transistor characteristic in which data is not destroyed, based on such a specific sample as described above.

In the following description, assume that the power supply voltage is fixed to 3 V, and that the threshold voltage $V_{tha}$ of the access transistor is 0.7 V.

As described with respect to the conventional example, in order to satisfy the requirement of stability of operation of a memory cell when the potential of a storage node is at the L level, the current supplying capability of the driver transistor must be larger than that of the access transistor. In FIG. 7, the ratio of the current supplying capability of the driver transistor to that of the access transistor is plotted along the abscissa, and the ratio of the current supplying capability of the bit line load transistor to that of the access transistor is plotted along the ordinate.

Because of the above description, the value on the abscissa must be 1.5 or more in order to secure an operating margin of a memory cell.

The results of calculation in the cases where the threshold voltage $V_{thd}$ of the driver transistor is 0.7 V and 0.85 V will be described hereinafter. First, consider the case where the threshold voltage $V_{thd}$ of the driver transistor is 0.7 V. When the ratio of the current supplying capability of the driver transistor to that of the access transistor is 1.5, which is the lower limit value, if the ratio of the current supplying capability of the bit line load transistor to that of the access transistor is 5 or less, the potential of a storage node which is at the L level does not exceed 0.7 V which is the threshold voltage of the driver transistor. In a range where the ratio of the current supplying capability of the driver transistor to that of the access transistor is larger than 1, data of a memory cell is not destroyed in a region indicated by cross hatching in FIG. 7.

On the other hand, when the threshold voltage $V_{thd}$ of the driver transistor is 0.85 V, the ratio of the current supplying capability of the driver transistor to that of the access transistor must be at least 1, which is the lower limit value. When the ratio of the current supplying capability of the driver transistor to that of the access transistor is this lower limit value, the ratio of the current supplying capability of the bit line load transistor to that of the access transistor may be 5 or less. In a range where the ratio of the current supplying capability of the driver transistor to that of the access transistor is still larger, data is not destroyed in a region indicated by hatching in FIG. 7.

According to the above results, it is found that a memory cell can operate stably in a region where at least the following two conditions are satisfied:

(Current supplying capability of driver transistor)/(current supplying capability of access transistor)$\geq 1$ (2)

(Current supplying capability of bit line load transistor)/(current supplying capability of access transistor)$\leq 5$ (3)

On the other hand, the current supplying capability $\beta$ of an MOS transistor is generally given by the following expression:

$$\beta = \mu C_{OX} W/L \quad (4)$$

In the above expression, $\mu$ is the mobility of a carrier, $C_{OX}$ is a capacitance per unit area of a gate insulating film of the MOS transistor, W is the gate width of the transistor, and L is the gate length of the transistor.

Therefore, by adjusting the gate widths or the gate lengths of the bit line load transistor, the access transistor, and the driver transistor so that the conditions of the above described expressions (2) and (3) are satisfied, data of the memory cell will not be destroyed.

In the present embodiment, an SRAM can be obtained which operates stably even in operation under low voltage by adjusting the gate width or the gate length of the bit line load transistor.

[Fourth Embodiment]

Figure 8:
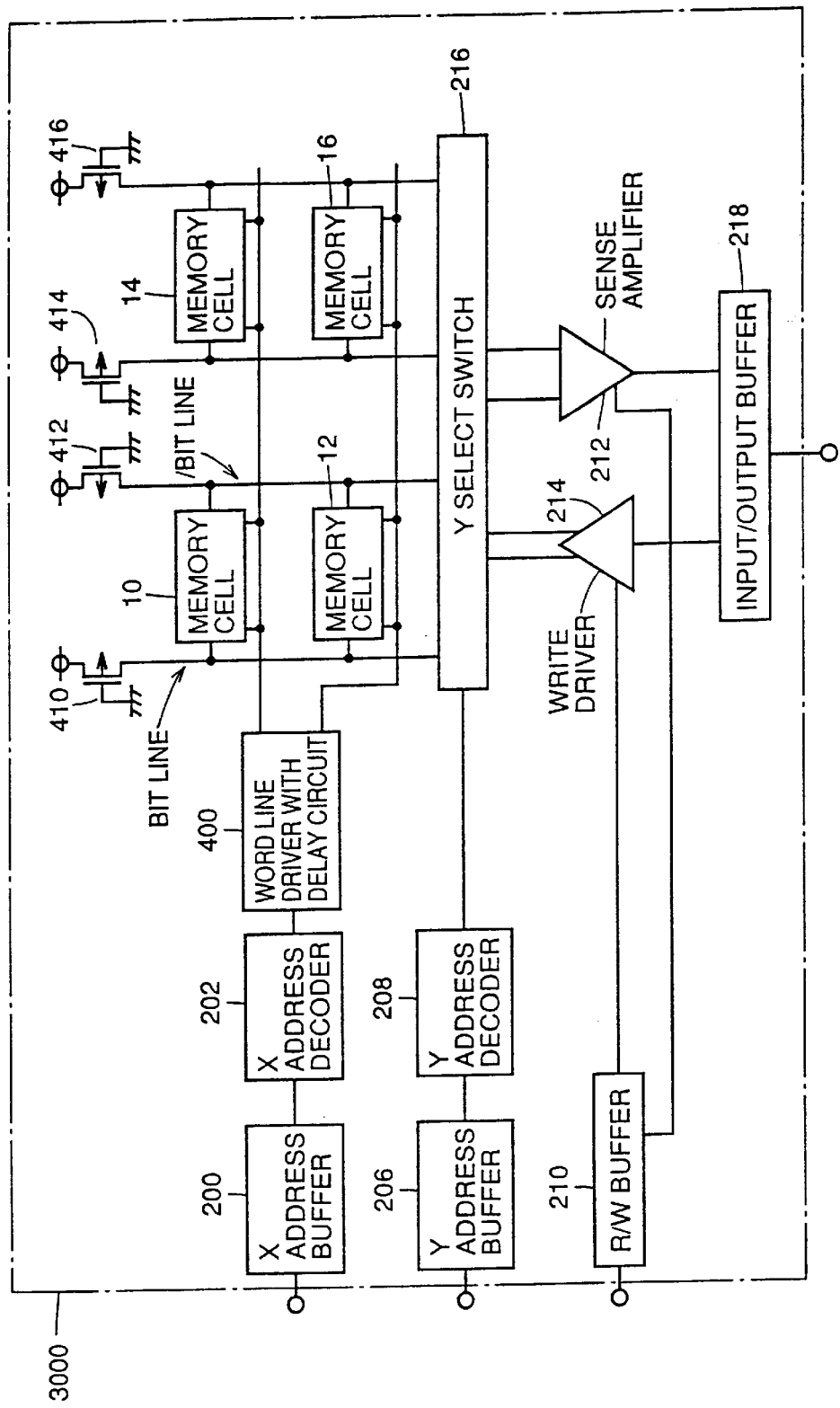
FIG. 8 is a schematic block diagram showing a structure of an SRAM according to a fourth embodiment of the present invention.

FIG. 8 is a schematic block diagram showing a structure of an SRAM 3000 of the fourth embodiment of the present invention.

As shown in the third embodiment, stable operation of a memory cell can be implemented by setting the current supplying capability of the bit line load transistor to a predetermined value or less even if the operating power supply voltage becomes low. However, in this case, the amount of current flowing through the bit line load transistor is small. Therefore, when the potential of the word line changes in order to access a particular memory cell, noise might be generated on the bit line and the /bit line. More specifically, change of the potential of the word line might influence the potential of the bit line through stray capacitance between the bit line and the word line.

In order to solve the above problem, a word line driver circuit 400 with a delay circuit is used in the present embodiment which can drive the word line with a predetermined delay time. If the word line is driven with a time constant longer than a specific time constant determined by the stray capacitance between the bit line and the word line, the resistance value of the word line and the like, a stable circuit operation which does not suffer from noise generated by the word line on the bit line can be implemented.

[Fifth Embodiment]

Figure 9:
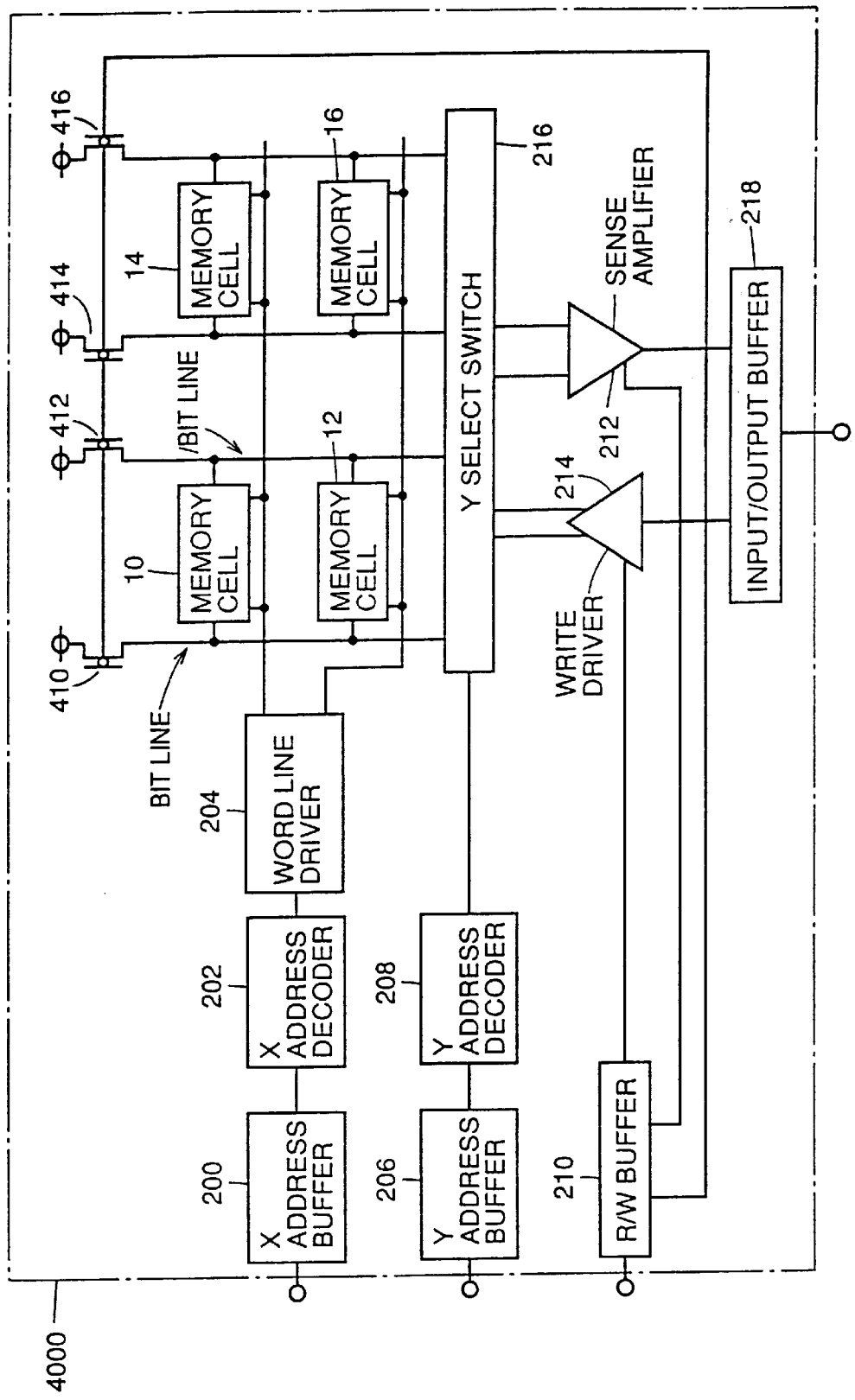
FIG. 9 is a schematic block diagram showing a structure of an SRAM according to a fifth embodiment of the present invention.

FIG. 9 is a schematic block diagram showing a structure of an SRAM 4000 according to the fifth embodiment of the present invention.

The fifth embodiment is different from the third embodiment in the following two points.

First, bit line load transistors 410 to 416 are depletion type MOS transistors.

Second, the gate potentials of the bit line load transistors are controlled by read/write buffer circuit 210.

In the third embodiment, the stability of a memory cell in the read operation was improved by making small the current supplying capabilities of bit line load transistors 410 to 416. However, when the read operation is not carried out, the bit line load which can supply much current is desired in order to stabilize the potential of the bit line.

In the present embodiment, the current supplying capabilities are decreased in the read operation with the gate potentials of bit line load transistors 420 to 426 being $V_{CC}$ ($V_g=V_{CC}$).

In the other operations, the current supplying capabilities are increased with $V_g=0$ V. As a result, both the stable read operation and the stable storage information holding operation can be implemented.

[Sixth Embodiment]

Figure 10:
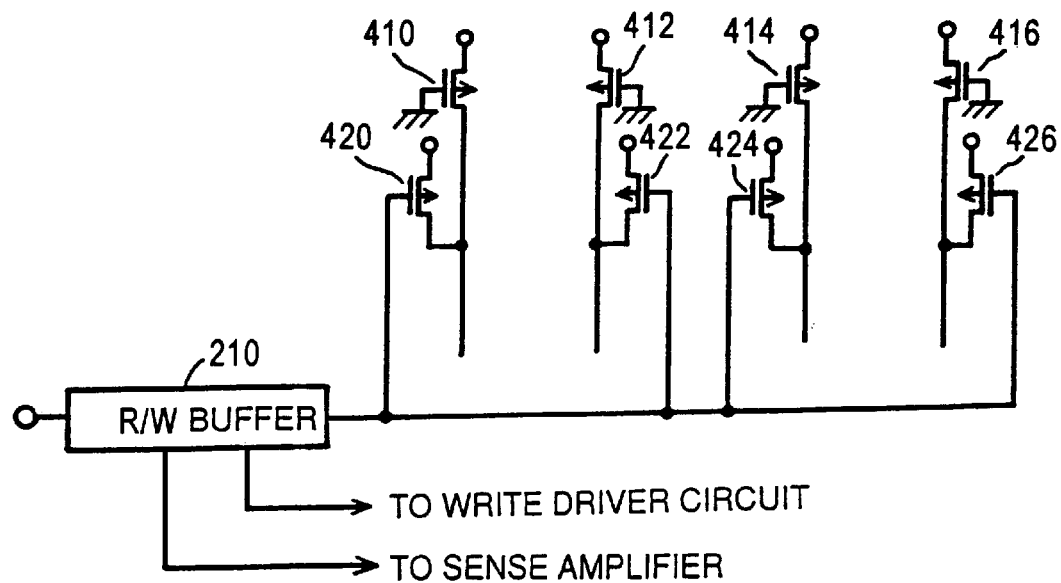
FIG. 10 is a block diagram showing a structure of a main portion of an SRAM according to a sixth embodiment of the present invention.

FIG. 10 is a circuit diagram showing a portion of read/write buffer circuit 210 and a bit line load element in an SRAM of the sixth embodiment of the present invention.

In the fifth embodiment, the current supplying capability of the bit line load was changed between the read operation and the other operations by forming the bit line load element of a depletion type MOS transistor. In this embodiment, the bit line load element is structured of enhancement type P type transistors 410 to 416 which are always rendered conductive and enhancement type P type transistors 420 to 426 which are connected to enhancement type P type transistors 410 to 416 in parallel, respectively.

The gate potentials of enhancement type P type transistors 420 to 426 are controlled by read/write buffer circuit 210. In the read operation, P type transistors 420 to 426 are rendered non-conductive. Therefore, similar to the case of the fifth embodiment, the current supplying capability of the bit line load element during the read operation is decreased, whereby the operation of a memory cell is stabilized.

On the other hand, during the operations other than the read operation, the P type transistors are rendered conductive, and the current supplying capability of the bit line load can be increased.

Therefore, similarly to the case of the fifth embodiment, both the stable read operation and the stable storage information holding operation can be implemented.

Further, the number of manufacturing steps is not increased by formation of the depletion type transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a memory cell array including a plurality of memory cells;
said each memory cell including
a flip-flop circuit having a first inverter having a first driver transistor of a first conductivity type and a first load transistor of a second conductivity type, and a second inverter having a second driver transistor of the first conductivity type and a second load transistor of the second conductivity type,
a first access transistor of the first conductivity type connected to an output node of said first inverter, and
a second access transistor of the first conductivity type connected to an output node of said second inverter;
first and second bit lines connected to at least one of said memory cells through said first and second access transistors;
first and second word lines connected to the gates of said first and second access transistors, respectively;
write operation control means for controlling potentials of said first and second word lines to render said first and second access transistors conductive to transmit complementary potentials of said first and second bit lines to said memory cell when information is written in said memory cell; and
read operation control means for controlling the potentials of said first and second word lines to render said first access transistor conductive and said second access transistor non-conductive to transmit an output of said first inverter to said first bit line when information is read out from said memory cell.

2. The semiconductor memory device according to claim 1, wherein
said first and second load transistors are thin film transistors.

3. The semiconductor memory device according to claim 1, wherein
a logical threshold value of said second inverter is equal to or less than one half an operating voltage, and larger than a low level value of a logical value.

4. A semiconductor memory device, comprising:
a memory cell array including a plurality of memory cells;
said each memory cell including a flip-flop circuit having a first inverter having a first driver transistor of a first conductivity type and a first load transistor of a second conductivity type, and a second inverter having a second driver transistor of the first conductivity type and a second load transistor of the second conductivity type, a first access transistor of the first conductivity type connected to an output node of said first inverter, and a second access transistor of the first conductivity type connected to an output node of said second inverter;

first and second bit lines connected to at least one of said memory cells through said first and second access transistors;

first and second word lines connected to the gates of said first and second access transistors, respectively;

write operation control means for controlling potentials of said first and second word lines to render said first and second access transistors conductive to transmit complementary potentials of said first and second bit lines to said memory cell when information is written in said memory cell; and read operation control means for controlling the potential of said first word line to render said first access transistor conductive to transmit an out put of said first inverter to said first bit line when information is read out from said memory cell, wherein a threshold voltage of said second driver transistor is higher than that of said first driver transistor.

5. A semiconductor memory device, comprising:

a memory cell array including a plurality of memory cells;

said each memory cell including a flip-flop circuit having a first inverter having a first driver transistor of a first conductivity type and a first load transistor of a second conductivity type, and a second inverter having a second driver transistor of the first conductivity type and a second load transistor of the second conductivity type, a first access transistor of the first conductivity type connected to an output node of said first inverter, and a second access transistor of the first conductivity type connected to an output node of said second inverter;

first and second bit lines connected to at least one of said memory cells through said first and second access transistors;

first and second word lines connected to the gates of said first and second access transistors, respectively;

write operation control means for controlling potentials of said first and second word lines to render said first and second access transistors conductive to transmit complementary potentials of said first and second bit lines to said memory cell when information is written in said memory cell; and read operation control means for controlling the potential of said first word line to render said first access transistor conductive to transmit an out put of said first inverter to said first bit line when information is read out from said memory cell, wherein a gate width of said second driver transistor is narrower than that of said first driver transistor.

6. A semiconductor memory device, comprising:

a memory cell array including a plurality of memory cells;

said each memory cell including a flip-flop circuit having a first inverter having a first driver transistor of a first conductivity type and a first load transistor of a second conductivity type, and a second inverter having a second driver transistor of the first conductivity type and a second load transistor of the second conductivity type, a first access transistor of the first conductivity type connected to an output node of said first inverter, and a second access transistor of the first conductivity type connected to an output node of said second inverter;

first and second bit lines connected to at least one of said memory cells through said first and second access transistors;

first and second word lines connected to the gates of said first and second access transistors, respectively;

write operation control means for controlling potentials of said first and second word lines to render said first and second access transistors conductive to transmit complementary potentials of said first and second bit lines to said memory cell when information is written in said memory cell; and read operation control means for controlling the potential of said first word line to render said first access transistor conductive to transmit an out put of said first inverter to said first bit line when information is read out from said memory cell, wherein said second bit line is formed in a lower level interconnection layer than that of said first bit line.

7. The semiconductor memory device according to claim 6, wherein said second bit line is a silicide interconnection.

* * * * *

UNITED STATES PATENT AND TRADEMARK OFFICE
CERTIFICATE OF CORRECTION

PATENT NO. : 5,774,393
DATED : June 30, 1998
INVENTOR(S) : Hirotada Kuriyama

It is certified that error appears in the above-identified patent and that said Letters Patent is hereby corrected as shown below:

Title page, item [54], and col. 1, should read as follows:

-- SEMICONDUCTOR MEMORY DEVICE CAPABLE OF OPERATING AT HIGH SPEED AND STABLY EVEN UNDER LOW POWER SUPPLY VOLTAGE --

Signed and Sealed this

Twenty-second Day of September, 1998

Attest:

BRUCE LEHMAN

Attesting Officer

Commissioner of Patents and Trademarks